United States Patent
Nishimura et al.

(12) 
(10) Patent No.: US 6,399,267 B1
(45) Date of Patent: Jun. 4, 2002

(54) RADIATION SENSITIVE RESIN COMPOSITION AND USE OF THE SAME IN AN INTERLAMINAR INSULATING FILM

(75) Inventors: Isao Nishimura; Masayoshi Suzuki; Fumiko Yonezawa; Masayuki Endo, all of Tokyo (JP)

(73) Assignee: JSR Corporation, Tokyo (JP)

( * ) Notice: Subject to any disclaimer, the term of this patent is extended or adjusted under 35 U.S.C. 154(b) by 55 days.

(21) Appl. No.: 09/584,776

(22) Filed: Jun. 1, 2000

(30) Foreign Application Priority Data

Jun. 4, 1999 (JP) .......................... 11-157463

(51) Int. Cl.⁷ .......................... G03F 7/023; G03F 7/30
(52) U.S. Cl. .......................... 430/192; 430/18; 430/191; 430/193; 430/326; 430/330
(58) Field of Search .................. 430/191, 192, 430/193, 326, 18, 330

(56) References Cited

U.S. PATENT DOCUMENTS

| | | | |
|---|---|---|---|
| 4,299,911 A | 11/1981 | Ochi et al. | |
| 4,377,631 A | 3/1983 | Toukhy et al. | |
| 4,384,037 A | 5/1983 | Hosaka et al. | |
| 4,407,895 A | * 10/1983 | Nakauchi et al. | 428/463 |
| 4,427,760 A | 1/1984 | Nagazawa et al. | |
| 4,493,884 A | 1/1985 | Nagano et al. | |
| 4,550,069 A | 10/1985 | Pampalone | |
| 4,738,915 A | 4/1988 | Komine et al. | |
| 4,929,536 A | 5/1990 | Spak et al. | |
| 4,946,757 A | 8/1990 | Seio et al. | |
| 5,112,719 A | 5/1992 | Yamada et al. | |
| 5,362,597 A | 11/1994 | Sano et al. | |
| 5,958,648 A | 9/1999 | Nishimura et al. | |

FOREIGN PATENT DOCUMENTS

| | | |
|---|---|---|
| EP | 0 307 828 | 3/1989 |
| EP | 0 428 398 | 5/1991 |
| EP | 0 430 477 | 6/1991 |
| EP | 0 845 708 | 6/1998 |
| GB | 2 054 617 | 2/1981 |
| JP | 11-52560 | 2/1999 |
| WO | WO 87/03706 | 6/1987 |

OTHER PUBLICATIONS

A. Shimada, et al, Chemical Abstracts, vol. 126, No. 5, p. 1221, AN 126: 67519q, "Radiation–Resin Composition", Feb. 3, 1997, (English Abstract only).

* cited by examiner

Primary Examiner—John S. Chu
(74) Attorney, Agent, or Firm—Oblon, Spivak, McClelland, Maier & Neustadt, P.C.

(57) ABSTRACT

A radiation sensitive resin composition which can be processed and molded at low temperatures and has resolution, solvent resistance, adhesion to a substrate and storage stability required as an interlaminar insulating film.

This radiation sensitive resin composition comprises:

(A) a copolymer obtained by copolymerizing (a1) an unsaturated carboxylic acid and/or an unsaturated carboxylic anhydride, (a2) an epoxy compound such as β-methylglycidyl acrylate and/or an epoxy compound such as a monomer represented by the following formula (3):

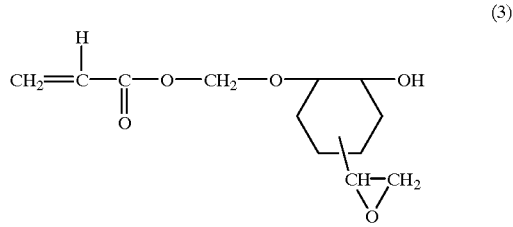

(3)

and (a3) an olefinic unsaturated compound other than the above (a1) and (a2); and (B) a 1,2-quinonediazide compound.

20 Claims, No Drawings

RADIATION SENSITIVE RESIN COMPOSITION AND USE OF THE SAME IN AN INTERLAMINAR INSULATING FILM

DETAILED DESCRIPTION OF THE INVENTION

The present invention relates to a radiation sensitive resin composition and to use of the same in an interlaminar insulating film. More specifically, it relates to a positive radiation sensitive resin composition suitable for the formation of an interlaminar insulating film by photolithography and to use of the same in an interlaminar insulating film, particularly a liquid crystal display element, integrated circuit element, magnetic head element, solid image pick-up element or the like.

Generally speaking, an interlaminar insulating film for insulating wiring layers from each other is formed in electronic parts such as thin film transistor (to be abbreviated as "TFT" hereinafter) liquid crystal display elements, magnetic head elements, integrated circuit elements and solid image pick-up elements. Photolithography which uses a radiation sensitive resin composition and is characterized in that the number of steps for obtaining a required interlaminar insulating film pattern is small and an interlaminar insulating film having satisfactory flatness is obtained is employed to form the interlaminar insulating film.

In the step of forming an interlaminar insulating film from a radiation sensitive resin composition, the optimum process conditions are selected and employed for each material constituting an electronic part in order to balance among such properties as resolution, solvent resistance, adhesion to a substrate and storage stability. When a high temperature is required for the processing and molding of an interlaminar insulating film under the above process conditions, elements other than the interlaminar insulating film are damaged by heating, whereby characteristic properties targeted for the electronic part may not be obtained. For example, a magnetic head (GMR head) comprising a great magnetic resistance film is used to increase reproduction, output thereof so as to improve the surface recording density of a hard disk drive. If this GMR head is heated at a temperature higher than 200° C., the direction of magnetization will become instable. Therefore, it must be avoided to heat the GMR head at a temperature higher than 200° C. However, in order to produce the GMR head, a recording coil having an interlaminar insulating film must be fabricated after the formation of a great magnetic resistance film according to the structure of the GMR head. To achieve a satisfactory function for the interlaminar insulating film, a conventional photosensitive resin composition which constitutes the interlaminar insulating film must be heated at a temperature higher than 200° C., thereby instabilizing the direction of magnetization of the great magnetic resistance film. Conventional photosensitive resin compositions involve such problems as low solvent resistance because a curing reaction does not proceed sufficiently at a heat treatment temperature lower than 200° C. or the formation of air bubbles between layers at the time of laminating because the curing reaction is accompanied by degassing.

That is, there has been unknown a photosensitive resin composition which allows for the processing and molding of an interlaminar insulating film at a low temperature that does not damage other element materials constituting an electronic part and has required resolution, solvent resistance, adhesion and storage stability as an interlaminar insulating film.

It is an object of the present invention which has been made under the above circumstances to provide a radiation sensitive resin composition which can be processed and molded at low temperatures and has required resolution, solvent resistance, adhesion to a substrate and storage stability as an interlaminar insulating film.

It is another object of the present invention to provide a process for producing an interlaminar insulating film from the above radiation sensitive resin composition.

It is still another object of the present invention to use the above radiation sensitive resin composition in an interlaminar insulating film.

It is a further object of the present invention to provide an interlaminar insulating film formed from the above radiation sensitive resin composition.

Other objects and advantages of the present invention will become apparent from the following description.

According to the present invention, firstly, the above objects and advantages of the present invention are attained by a radiation sensitive resin composition comprising:

(A) a copolymer (to be referred to as "copolymer (A)") obtained by copolymerizing (a1) at least one carboxylic acid compound (to be referred to as "compound (a1)" hereinafter) selected from the group consisting of an unsaturated carboxylic acid and an unsaturated carboxylic anhydride, (a2) at least one unsaturated epoxy compound (to be referred to as "compound (a2)" hereinafter) selected from the group consisting of a monomer represented by the following formula (1):

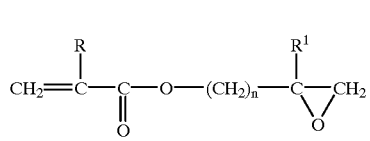

(1)

wherein R is a hydrogen atom or methyl group, $R^1$ is an alkyl group having 1 to 4 carbon atoms, and n is an integer of 1 to 6, and a monomer represented by the following formula (2):

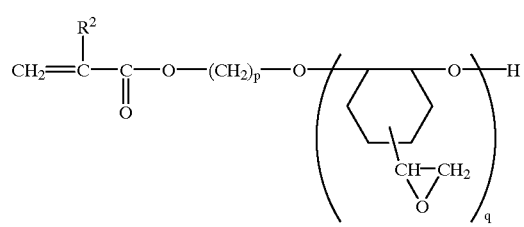

(2)

wherein $R^2$ is a hydrogen atom or methyl group, p is an integer of 1 to 6, and q is an integer of 1 to 6, and (a3) an olefinic unsaturated compound (to be referred to as "compound (a3)" hereinafter) other than the above (a1) and (a2); and (B) a 1,2-quinonediazide compound.

Secondly, the above objects and advantages of the present invention are attained by a process for producing an interlaminar insulating film, comprising the steps of:

(1) preparing a substrate for an interlaminar insulating film having a thin film formed from the above radiation sensitive resin composition of the present invention;

(2) exposing the thin film to radiation through a predetermined pattern mask;

(3) developing the exposed thin film with an alkali developer to form a thin film pattern; and (4) heating the thin film pattern at a temperature lower than 200° C.

Thirdly, the above objects and advantages of the present invention are attained by use of the above radiation sensitive resin composition of the present invention in an interlaminar insulating film.

In the fourth place, the above objects and advantages of the present invention are attained by an interlaminar insulating film formed from the above radiation sensitive resin composition of the present invention.

The term "radiation" as used herein means ultraviolet radiation, far ultraviolet radiation, X-radiation, electron beams, molecular beams, γ-radiation, synchrotron radiation, proton beams and the like.

The radiation sensitive resin composition of the present invention will be detailed hereinunder.

The radiation sensitive resin composition of the present invention comprises a copolymer (A) and a 1,2-quinonediazide compound (B).

Copolymer (A)

The copolymer (A) can be produced, for example, by radical polymerizing the compound (a1), compound (a2) and compound (a3) in a solvent in the presence of a polymerization initiator.

The copolymer (A) used in the present invention contains a constituent unit derived from the compound (a1) in an amount of preferably 5 to 40 wt %, particularly preferably 10 to 35 wt %. When the amount of this constituent unit is smaller than 5 wt %, the copolymer hardly dissolves in an alkali aqueous solution and when the amount of this constituent unit is larger than 40 wt %, the solubility in an alkali aqueous solution of the copolymer tends to become too large. Illustrative examples of the compound (a1) include carboxylic acids such as acrylic acid, methacrylic acid and crotonic acid; dicarboxylic acids such as maleic acid, fumaric acid, citraconic acid, mesaconic acid and itaconic acid: anhydrides of these dicarboxylic acids; mono[(meth) acryloyloxyalkyl] esters of polycarboxylic acids (i.e. bivalent and polyvalent carboxylic acids) such as mono[2-(meth) acryloyloxyethyl]succinate and mono[2-(meth) acryloyloxyethyl]phthalate; and mono(meth)acrylates of polymers having a carboxyl group and hydroxyl group at both terminals such as ω-carboxypolycaprolactone mono (meth)acrylate. Out of these, acrylic acid, methacrylic acid and maleic anhydride are preferred from the viewpoints of copolymerization reactivity solubility in an alkali aqueous solution and easy acquisition. They may be used alone or in combination.

The copolymer (A) used in the present invention contains a constituent unit derived from the compound (a2) in an amount of preferably 5 to 60 wt %, particularly preferably 10 to 50 wt %. When the amount of the constituent unit is smaller than 5 wt %, the heat resistance of the obtained coating film tends to lower and when the amount of the constituent unit is larger than 60 wt %, the storage stability of the copolymer is liable to lower.

The compound (a2) is represented by the formula (1) or (2). In the formula (1), R is a hydrogen atom or methyl group, $R^1$ is an alkyl group having 1 to 4 carbon atoms, and n is an integer of 1 to 6. The alkyl group having 1 to 4 carbon atoms represented by $R^1$ may be linear or branched.

Illustrative examples of the compound (a2) represented by the formula (1) include β-methylglycidyl (meth)acrylate, β-ethylglycidyl (meth)acrylate, β-propylglycidyl (meth) acrylate, β-methylglycidyl α-ethylacrylate, 3-methyl-3,4-epoxybutyl (meth)acrylate, 3-ethyl-3,4-epoxybutyl (meth) acrylate, 4-methyl-4,5-epoxypentyl (meth)acrylate and 5-methyl-5,6-epoxyhexyl (meth)acrylate.

In the formula (2), $R^2$ is a hydrogen atom or methyl group, p is an integer of 1 to 6, and q is an integer of 1 to 6. In the formula (2), the epoxy group may be bonded to any position, for example, 3-position or 4-position of a cyclohexane ring. It should be understood that the compound of the formula (2) is such a position isomer or a mixture thereof.

Illustrative examples of the compound (a2) represented by the formula (2) include compounds represented by the following formulas (3) to (8).

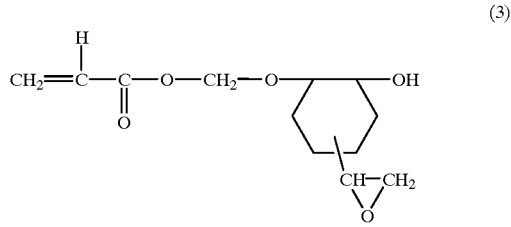

(3)

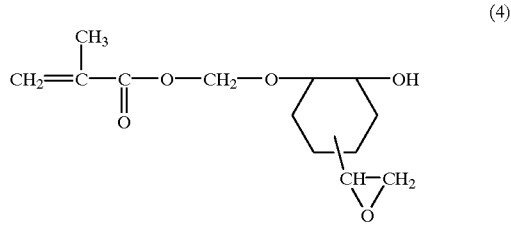

(4)

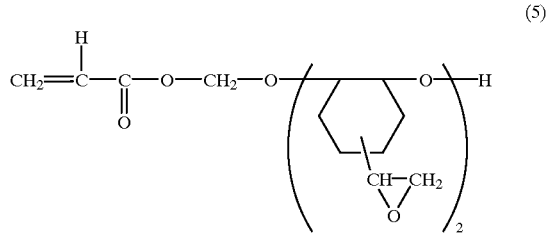

(5)

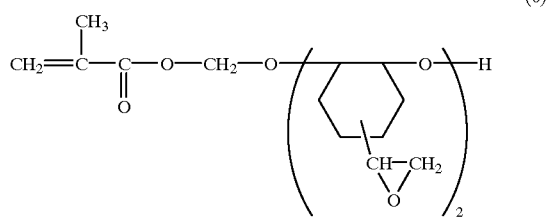

(6)

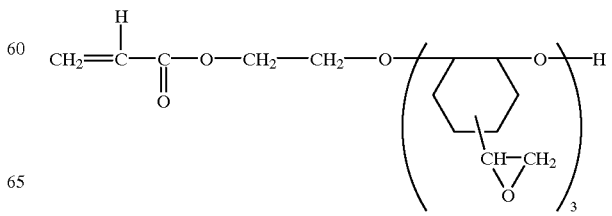

(7)

(8)

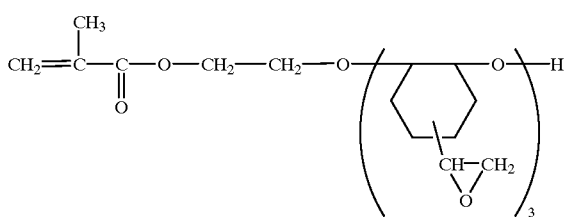

Out of these, β-methylglycidyl (meth)acrylate, 3-methyl-3,4-epoxybutyl (meth)acrylate and compounds represented by the above formulas (7) and (8) are preferred because the obtained photosensitive resin composition has a wide process margin and solvent resistance in particular is improved. These compounds can be acquired under the trade names of M-GMA and CYMA300 (of Daicel Kagaku Co., Ltd.). They may be used alone or in combination.

The copolymer (A) used in the present invention further contains a constituent unit derived from the compound (a3) in an amount of preferably 10 to 80 wt %, particularly preferably 20 to 70 wt %. When the amount of this constituent unit is smaller than 10 wt %, the storage stability of the copolymer (A) tends to low and when the amount is larger than 80 wt %, the copolymer (A) hardly dissolves in an alkali aqueous solution.

Illustrative examples of the compound (a3) include alkyl methacrylates such as methyl methacrylate, ethyl methacrylate, n-butyl methacrylate, sec-butyl methacrylate and t-butyl methacrylate; alkyl acrylates such as methyl acrylate and isopropyl acrylate; cyclic alkyl methacrylates such as cyclohexyl methacrylate, 2-methylcyclohexyl methacrylate, tricyclo[5.2.1.0$^{2,6}$]decan-8-yl methacrylate (commonly called "dicyclopentanyl methacrylate" in this technical field), dicyclopentanyloxyethyl methacrylate and isobornyl methacrylate; cyclic alkyl acrylates such as cyclohexyl acrylate, 2-methylcyclohexyl acrylate, tricyclo [5.2.1.0$^{2,6}$]decan-8-yl acrylate (commonly called "dicyclopentanyl acrylate" in this technical field), dicyclopentanyloxyethyl acrylate and isobornyl acrylate; aryl methacrylates such as phenyl methacrylate and benzyl methacrylate; aryl acrylates such as phenyl acrylate and benzyl acrylate; dicarboxylic diesters such as diethyl maleate, diethyl fumarate and diethyl itaconate; hydroxyalkyl esters such as 2-hydroxyethyl methacrylate and 2-hydroxypropyl methacrylate; styrene, α-methylstyrene, m-methylstyrene, p-methylstyrene, o-methylstyrene, p-methoxystyrene, acrylonitrile, methacrylonitrile, vinyl chloride, vinylidene chloride, acrylamide, methacrylamide, vinyl acetate, 1,3-butadiene, isoprene, 2,3-dimethyl -1,3-butadiene, phenylmaleimide, ethylene glycol diacrylate, diethylene glycol diacrylate, triethylene glycol diacrylate, neopentyl glycol diacrylate, glycerol diacrylate, ethylene glycol dimethacrylate, diethylene glycol dimethacrylate, triethylene glycol dimethacrylate, neopentyl glycol dimethacrylate and glycerol dimethacrylate; cyclohexylmaleimide, benzylmaleimide, N-succinimidyl-3-maleimide benzoate, N-succinimidyl-4-maleimide butyrate, N-succinimidyl6- maleimide caproate, N-succinimidyl-3-maleimide propionate and N-(9-acridinyl)maleimide; and bicyclo[2.2.1]hept-2-ene, 5-methylbicyclo[2.2.1]hept-2-ene, 5-ethylbicyclo[2.2.1]hept-2-ene, 5-hydroxybicyclo [2.2.1]hept-2-ene, 5-carboxybicyclo[2.2.1]hept-2-ene, 5-hydroxymethylbicyclo[2.2.1]hept-2-ene,5-(2'-hydroxyethyl)bicyclo[2.2.1]hept-2-ene,5-methoxybicyclo [2.2.1]hept-2-ene, 5-ethoxybicyclo[2.2.1]hept-2-ene, 5,6-dihydroxybicyclo[2.2.1]hept-2-ene, 5,6-dicarboxybicyclo [2.2.1]hept-2-ene, 5,6-di(hydroxymethyl)bicyclo[2.2.1] hept-2-ene, 5,6-di(2'-hydroxyethyl)bicyclo[2.2.1]hept-2-ene, 5,6-dimethoxybicyclo[2.2.1]hept-2-ene, 5,6-diethoxybicyclo[2.2.1]hept-2-ene, 5-hydroxy-5-methylbicyclo[2.2.1]hept-2-ene, 5-hydroxy-5-ethylbicyclo [2.2.1]hept-2-ene, 5carboxy-5-methylbicyclo[2.2.1]hept-2-ene, 5-carboxy-5-ethylbicyclo[2.2.1]hept-2-ene,5-hydroxymethyl-5 -methylbicyclo[2.2.1]hept-2-ene, 5-carboxy-6-methylbicyclo[2.2.1]hept-2-ene, 5-carboxy6-ethylbicyclo[2.2.1]hept-2-ene,5,6-dicarboxybicyclo[2.2.1] hept-2-ene anhydride, 5-t-butoxycarbonylbicyclo[2.2.1] hept-2-ene, 5-cyclohexyloxycarbonylbicyclo[2.2.1]hept-2-ene, 5-phenoxycarbonylbicyclo[2.2.1]hept-2-ene, 5,6-di(t-butoxycarbonyl)bicyclo[2.2.1]hept-2-ene and 5,6-di (cyclohexyloxycarbonyl)bicyclo[2.2.1]hept-2-ene.

Out of these, styrene, t-butyl methacrylate, dicyclopentanyl methacrylate, p-methoxystyrene, 2-methylcyclohexyl acrylate, phenylmaleimide, 1,3-butadiene, ethylene glycol dimethacrylate, diethylene glycol dimethacrylate, glycerol dimethacrylate, cyclohexylmaleimide and bicyclo[2.2.1] help-2-ene are preferred from the viewpoints of copolymerization reactivity, the controllability of molecular weight distribution and solubility in an alkali aqueous solution. They may be used alone or in combination.

Illustrative examples of the solvent used for the preparation of the copolymer (A) include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate, ethyl cellosolve acetate; diethylene glycols such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol monomethyl ether, propylene glycol monoethyl ether, propylene glycol monopropyl ether and propylene glycol monobutyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

The polymerization initiator used for the preparation of the copolymer (A) is what is generally known as a radical polymerization initiator, as exemplified by azo compounds such as 2,2'-azobisisobutyronitrile, 2,2'-azobis-(2,4-dimethylvaleronitrile) and 2,2'-azobis-(4-methoxy-2,4-dimethylvaleronitrile); organic peroxides such as benzoyl peroxide, lauroyl peroxide, t-butylperoxy pivalate and 1,1'-bis-(t-butylperoxy)cyclohexane; and hydroperoxides. When a peroxide is used as a radical polymerization initiator, it may be used in combination with a reducing agent as a redox initiator.

A molecular weight modifier for controlling molecular weight may be used in the preparation of the copolymer (A). Illustrative examples of the molecular weight modifier include hydrocarbon halides such as chloroform and carbon tetrabromide; mercaptans such as n-hexyl mercaptan, n-octyl mercaptan, n-dodecyl mercaptan, tert-dodecyl mercaptan and thioglycolic acid; xanthogens such as dimethylxanthogen sulfide and diisopropylxanthogen disulfide; terpinolene and α-methylstyrene dimer.

As described above, the copolymer (A) used in the present invention has a carboxyl group and/or a carboxylic anhydride group and an epoxy group and appropriate solubility in an alkali aqueous solution, and can be easily cured by heating without using a special curing agent.

The radiation sensitive resin composition containing the above copolymer (A) can form easily a predetermined coating film pattern without an undeveloped portion after development and a film thickness reduction.

1,2-quinonediazide compound (B)

The 1,2-quinonediazide compound (B) used in the present invention is, for example, a 1,2-benzoquinonediazidesulfonic acid ester, 1,2-naphthoquinonediazidesulfonic acid ester, 1,2-benzoquinonediazidesulfonic acid amide or 1,2-naphthoquinonediazidesulfonic acid amide. Illustrative examples of the 1,2-quinonediazide compound include 1,2-naphthoquinonediazidesulfonic acid esters of trihydroxybenzophenone such as 2,3,4-trihydroxybenzophenone-1,2-naphthoquinoneazide-4-sulfonic acid ester, 2,3,4-trihydroxybenzophenone-1,2-naphthoquinonediazide-5-sulfonicacid ester 2,4,6-trihydroxybenzophenone-1,2-naphthoquinonediazide-4-sulfonic acid ester and 2,4,6-trihydroxybenzophenone -1,2-naphthoquinonediazide-5-sulfonic acid ester; 1,2-naphthoquinone diazidesulfonic acid esters of tetrahydroxybenzophenone such as 2,2',4,4'-tetrahydroxybenzophenone-1,2-naphthoquinonediazide-4-sulfonic acid ester, 2,2',4,4'-tetrahydroxybenzophenone -1,2-naphthoquinonediazide-5-sulfonic acid ester, 2,3,4,3'-tetrahydroxybenzophenone-1,2-naphthoquinonediazide-4-sulfonicacid ester, 2,3,4,3'-tetrahydroxybenzophenone-1,2-naphthoquinonediazide-5-sulfonic acid ester, 2,3,4,4'-tetrahydroxybenzophenone-1,2-naphthoquinonediazide-4-sulfonic acid ester, 2,3,4,4'-tetrahydroxybenzophenone-1,2-naphthoquinonediazide-5-sulfonicacid ester, 2,3,4,2'-tetrahydroxy-4'-methylbenzophenone-1,2-naphthoquinonediazide-4-sulfonic acid ester, 2,3,4,2'-tetrahydroxy-4'-methylbenzophenone-1,2-naphthoquinonediazide-5-sulfonic acid ester, 2,3,4,4'-tetrahydroxy-3'-methoxybenzophenone-1,2-naphthoquinonediazide-4-sulfonic acid ester and 2,3,4,4'-tetrahydroxy-3'-methoxybenzophenone-1,2-naphthoquinonediazide-5-sulfonic acid ester; and 1,2-naphthoquinonediazidesulfonic acid esters of (polyhydroxyphenyl)alkane such as 2,3,4,2',6'-penta-4-sulfonic acid ester, tri(p-hydroxyphenyl)methane-1,2-naphtoquinonediazide-5-sulfonic acid ester, 1,1,1-tri(p-hydroxyphenyl)ethane-1,2-naphthoquinonediazide-4-sulfonic acid ester, 1,1,1-tri(p-hydroxyphenyl)ethane-1,2-naphthoquinonediazide-5-sulfonicacid ester, bis(2,3,4-trihydroxyphenyl)methane-1,2-naphthoquinonediazide-4-sulfonicacid ester, bis(2,3,4-trihydroxyphenyl)methane-1,2-naphthoquinonediazide-5-sulfonic acid ester, 2,2-bis(2,3,4-trihydroxyphenyl)propane-1,2-naphthoquinonediazide-4-sulfonic acid ester, 2,2-bis(2,3,4-trihydroxyphenyl)propane-1,2-naphthoquinonediazide-5-sulfonic acid ester, 1,1,3-tris(2,5-dimethyl-4-hydroxyphenyl)-3-phenylpropane-1,2-naphthoquinonediazide-4-sulfonic acid ester, 1,1,3-tris(2,5-dimethyl-4-hydroxyphenyl)-3-phenylpropane-1,2-naphthoquinonediazide-5-sulfonic acid ester, 4,4'-[1-[4-[1-[4-hydroxyphenyl]-1-methylethyl]phenyl]ethylidene]bisphenol-1,2-naphthoquinonediazide-4-sulfonicacid ester, 4,4'-[1-[4-[1-[4hydroxyphenyl]-1-methylethyl]phenyl]ethylidene]bisphenol-1,2-naphthoquinonediazide-5-sulfonic acid ester, bis(2,5-dimethyl-4-hydroxyphenyl)-2-hydroxyphenylmethane-1,2-naphthoquinonediazide-4-sulfonic acid ester, bis(2,5-dimethyl-4-hydroxyphenyl)-2-hydroxyphenylmethane-1,2-naphthoquinonediazide-5-sulfonic acid ester, 3,3,3',3'-tetramethyl-1,1'-spyrobiindene-5,6,7,5',6',7'-hexanol-1,2-naphthoquinonediazide-4-sulfonic acid ester, 3,3,3',3'-tetramethyl-1,1'-spyrobiindene-5,6,7,5',6',7'-hexanol-1,2-naphthoquinonediazide-5-sulfonic acid ester, 2,2,4-trimethyl-7,2',4'-trihydroxyflavan-1,2-naphthoquinonediazide-4-sulfonicacid ester and 2,2,4-trimethyl-7,2',4'-trihydroxyflavan-1,2-naphthoquinonediazide-5-sulfonic acid ester.

These 1,2-quinonediazide compounds may be used alone or in combination of two or more.

The amount of the component (B) is preferably 5 to 100 parts by weight, more preferably 10 to 50 parts by weight based on 100 parts by weight of the component (A).

When the amount is smaller than 5 parts by weight, the amount of an acid generated by exposure to radiation is small, whereby the difference of solubility in an alkali aqueous solution as a developer between exposed portions and unexposed portions becomes small and patterning becomes difficult. Further, since the amount of an acid which takes part in the reaction of an epoxy group is small, sufficient heat resistance and solvent resistance cannot be obtained. When the amount is larger than 100 parts by weight, an unreacted portion of the component (B) remains in large quantities with short-time exposure to radiation, thereby making development difficult due to its large effect of insolubilizing in the alkali aqueous solution.

<Other Components>

The radiation sensitive resin composition of the present invention may contain a heat sensitive acid forming compound as a component (C), a polymerizable compound having at least one ethylenic unsaturated double bond as a component (D), an epoxy resin as a component (E), a surfactant as a component (F) and an adhesive aid as a component (G) as required, in addition to the above components (A) and (B).

The heat sensitive acid forming compound as the component (C) may be used to improve heat resistance and hardness. Illustrative example of the heat sensitive acid forming compound includes an antimony fluoride. Its commercially available products include San-Aid SI-L80, San-Aid SI-L110 and San-Aid SI-L150 (of Sanshin Chemical Industry Co., Ltd.).

The amount of the component (C) is preferably 20 parts or less by weight, more preferably 5 parts or less by weight based on 100 parts by weight of the alkali soluble resin as the component (A).

When the amount is larger than 20 parts by weight, a precipitate is formed, making patterning difficult.

The polymerizable compound having at least one ethylenic unsaturated double bond as the component (D) is preferably a compound having at least one, preferably 1 to 3 (meth)acrylate structures in the molecule.

Illustrative examples of the compound having one (meth) acrylate structure in the molecule include 2-hydroxyethyl (meth)acrylate, carbitol (meth)acrylate, isobornyl (meth) acrylate, 3-methoxybutyl (meth)acrylate and 2-(meth) acryloyloxyethyl-2-hyroxypropyl phthalate. Commercially available products of the compound include Aronix M-101, M-111 and M-114 (of Toagosei Co., Ltd.), KAYARAD TC-110S and TC-120S (of Nippon Kayaku Co., Ltd.), and Viscoat 158 and 2311 (of Osaka Organic Chemical Industry, Ltd.).

Illustrative examples of the compound having two (meth) acrylate structures in the molecule include ethylene glycol (meth)acrylate, 1,6-hexanediol di(meth)acrylate, 1,9-nonanediol di(meth)acrylate, polypropylene glycol di(meth) acrylate, tetraethylene glycol di(meth)acrylate, bisphenoxyethanolfluorene diacrylate and bisphenoxyethanolfluorene diacrylate. Commercially available products of the compound include Aronix M-210, M-240 and M-6200 (of Toagosei Co., Ltd.), KAYARAD HDDA, HX-220 and R-604 (of Nippon Kayaku Co., Ltd.) and Viscoat 260, 312 and 335 HP (of Osaka Organic Chemical Industry, Ltd.)

Illustrative examples of the compound having three or more (meth)acrylate structures in the molecule include trimethylolpropane tri(meth)acrylate, pentaerythritol tri(meth) acrylate, tri((meth)acryloyloxyethyl)phosphate, pentaerythritol tetra(meth)acrylate, dipentaerythritol penta(meth) acrylate and dipentaerythritol hexa(meth)acrylate. Commercially available products of the compound include Aronix M-309, M-400, M-405, M-450, M-7100, M-8030 and M-8060 (of Toagosei Co., Ltd. ) KAYARAD TMPTA, DPHA, DPCA-20, DPCA-30, DPCA-60 and DPCA-120 (of Nippon Kayaku Co., Ltd.), and Viscoat 295, 300, 360, GPA, 3PA and 400 (of Osaka Organic Chemical Industry, Ltd.).

These compounds having at least one (meth)acrylate structure in the molecule may be used alone or in combination.

The amount of the component (D) is preferably 50 parts or less by weight, more preferably 30 parts or less by weight based on 100 parts by weight of the component (A).

When the component (D) is contained in that amount, the heat resistance, strength and the like of a thin film pattern obtained from the radiation sensitive resin composition can be improved. When the amount is larger than 50 parts by weight, the solubility in an alkali soluble resin of the component (A) becomes unsatisfactory and a rough film may be formed by coating.

The epoxy resin as the companion (E) is not limited to a particular kind if its compatibility is not affected. Preferred examples of the epoxy resin include bisphenol A epoxy resins, phenol novolak epoxy resins, cresol novolak epoxy resins, cyclic aliphatic epoxy resins, glycidyl ester epoxy resins, glycidyl amine epoxy resins, heterocyclic epoxy resins and copolymer resins of glycidyl methacrylate.

Out of these, bisphenol A epoxy resins, cresol novolak epoxy resins and glycidyl ester epoxy resins are particularly preferred.

The amount of the component (E) is preferably 30 parts or less by weight based on 100 parts by weight of the alkali soluble resin.

When the component (E) is contained in that amount, the strength and the like of a coating film obtained from the radiation sensitive resin composition can be further improved.

When the amount is larger than 30 parts by weight, the compatibility for an alkali soluble resin of the component (A) becomes unsatisfactory and sufficient coating film forming ability cannot be obtained.

Although it can be said that the component (A) is an epoxy resin, the component (A) differs from the component (E) in that it has alkali solubility and is a higher molecular weight material than the component (E).

Illustrative examples of the surfactant as the component (F) include fluorine- and silicone-based surfactants such as BM-1000, BM-1100 (of BM CHEMIE Co., Ltd.), Megafac F142D, F172, F173 and F183 (of Dainippon Ink and Chemicals, Inc.), Florad FC-135, FC-170C, FC-430 and FC431(of Sumitomo 3M Limited), Surflon S-112, S-113, S-131, S-141, S-145, S-382, SC-101, SC-102, SC-103, SC-104, SC105and SC-106 (of Asahi Glass Co., Ltd.), F Top EF301, 303 and 352 (of Shin Akita Kasei Co., Ltd.), SH-28PA, SH-190, SH-193, SZ-6032, SF-8428, DC-57 and DC-190 (of Dow Corning Toray Silicone Co., Ltd.); polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; nonionic surfactants such as polyoxyethylene dialkyl esters exemplified by polyoxyethylene dilaurate and polyoxyethylene distearate; organosiloxane polymer KP341 (of Shin-Etsu Chemical Co., Ltd.), and Polyflow No. 57 and 95 (meth)acrylic acid-based copolymers (of Kyoeisya Chemical Co., Ltd.).

The surfactant is used in an amount of preferably 5 parts or less by weight, more preferably 2 parts or less by weight based on 100 parts by weight of the copolymer (A). When the amount of the surfactant is larger than 5 parts by weight, a rough film is easily formed by coating.

The adhesive aid as the component (G) is preferably a functional silane coupling agent such as a silane coupling agent having a reactive substituent such as a carboxyl group, methacryloyl group, isocyanate group or epoxy group. Illustrative examples of the component (G) include trimethoxysilylbenzoic acid, γ-methacryloxypropyl trimethoxysilane, vinyltriacetoxysilane, vinyltrimethoxysilane, γ-isocyanatepropyl triethoxysilane, γ-glycidoxypropyl trimethoxysilane and β-(3,4-epoxycyclohexyl)ethyl trimethoxysilane.

The adhesive aid is used in an amount of preferably 20 parts or less by weight, more preferably 10 parts or less by weight based on 100 parts by weight of the copolymer (A). When the amount of the adhesive aid is larger than 20 parts by weight, an undeveloped portion is easily produced.

The radiation sensitive resin composition of the present invention is prepared by uniformly mixing the above copolymer (A) and 1,2-quinonediazide compound (B) and the above other compounding ingredients as required. The radiation sensitive resin composition of the present invention is generally used in the form of a solution by dissolving in an appropriate solvent. For example, the radiation sensitive resin composition in the form of a solution can be prepared by mixing the copolymer (A), 1,2-quinonediazide compound (B) and other compounding ingredients with a solvent in a predetermined ratio.

The solvent used to prepare the radiation sensitive resin composition of the present invention is a solvent which uniformly dissolves the copolymer (A), 1,2-quinonediazide compound (B) and optional components (C) to (G) and does not react with these components.

Illustrative examples of the solvent include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butylmethoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

Out of these solvents, glycol ethers, ethylene glycol alkyl ether acetates, propylene glycol alkyl ether acetates, esters and diethylene glycols are preferred from the viewpoint of solubility, reactivity with the components and coating film forming ease.

A high-boiling solvent may be used in combination with the above solvent. Illustrative examples of the highboiling solvent usable include N-methylformamide, N,N-dimethylformamide, N-methylformanilide, N-methylacetamide, N,N-dimethylacetamide, N-methylpyrrolidone, dimethyl sulfoxide, benzylethyl ether, dihexyl ether, acetonile acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The composition solution prepared as described above maybe used after it is filtered with a millipore filter having a pore diameter of about 0.5 μm.

Formation of Interlaminar Insulating Film

A description is subsequently given of a process for forming the interlaminar insulating film of the present invention from the radiation sensitive resin composition of the present invention.

The process for producing an interlaminar insulating film comprises the steps of:

(1) preparing a substrate for an interlaminar insulating film having a thin film formed from the radiation sensitive resin composition of the present invention;

(2) exposing the thin film to radiation through a predetermined pattern mask;

(3) developing the thin film with an alkali developer to form a thin film pattern; and (4) heating the film pattern at a temperature lower than 200° C.

The above step (1) can be carried out by coating the solution of the radiation sensitive resin composition of the present invention on the surface of a substrate, that is, a substrate for an interlaminar insulating film and removing the solvent by prebaking to form a thin film. Coating may be spray coating, roll coating, spin coating or the like.

The prebaking conditions, which differ according to the types and amounts of components, are most preferably a temperature of 70 to 90° C. and a time of 1 to 15 minutes. The radiation sensitive resin composition of the present invention has a process margin at a prebaking temperature of up to about 110° C.

In the following step (2), the thin film is exposed to radiation such as ultraviolet radiation through a predetermined pattern mask. In the next step (3), the thin film is developed with an alkali developer to remove unrequired portions and form a predetermined pattern. Development may be puddle development, dipping development or shower development, and the development time is generally 30 to 180 seconds.

The developer is an alkali aqueous solution exemplified by aqueous solutions of inorganic alkalis such as sodium hydroxide, potassium hydroxide, sodium carbonate, sodium silicate, sodium metasilicate and ammonia; primary amines such as ethylamine and n-propylamine; secondary amine such as diethylamine and di-n-propylamine; tertiary amines such as trimethylamine, methyldiethylamine, dimethylethylamine and triethylamine; tertiary alkanol amines such as dimethyl ethanol amine, methyl diethanol amine and triethanol amine; cyclic tertiary amines such as pyrrole, piperidine, N-methylpiperidine, N-methylpyrrolidine, 1,8-diazabicyclo [5.4.0]-7-undecene and 1,5-diazabicyclo[4.3.0]-5-nonene; aromatic tertiary amines such as pyridine, collidine, lutidine and quinoline; and quaternary ammonium salts such as tetramethyl ammonium hydroxide and tetraethyl ammonium hydroxide. An aqueous solution prepared by adding a water-soluble organic solvent such as methanol or ethanol and/or a surfactant to the above alkali aqueous solution in an appropriate amount may be used as the developer.

After development, the developed thin film is washed with running water for 30 to 90 seconds to remove unrequired portions and dried with compressed air or compressed nitrogen to form a pattern. In the subsequent step (4), this pattern is heated with a heater such as a hot plate or oven at a temperature lower than 200° C., for example, 130 to 190° C. for a predetermined time, for example, 5 to 60 minutes on a hot plate or 30 to 90 minutes in an oven to obtain a coating film pattern for an interlaminar insulating film of interest.

Prior to the step (4), the pattern formed in the step (3) may be exposed to radiation such as ultraviolet radiation.

The radiation sensitive resin composition of the present invention is useful for the formation of an interlaminar insulating film, particularly an interlaminar insulating film for the recording coil of a magnetic head, for example, a giant magnetoresistive head.

The following Synthesis Examples, Examples and Comparative Examples are provided for the purpose of further illustrating the present invention but are in no way to be taken as limiting. In the Examples, "%" means "wt %" unless otherwise stated.

SYNTHESIS EXAMPLE 1

7 parts by weight of 2,2'-azobis(2,4-dimethylvaleronitrile)and 220 parts by weight of propylene glycol monomethyl ether acetate were charged into a flask equipped with a cooling pipe and a stirrer. Subsequently, 22 parts by weight of methacrylic acid, 38 parts by weight of dicyclopentanyl methacrylate, 40 parts by weight of β-methylglycidyl methacrylate and 1.5 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-1). The obtained polymer solution had a solids content of 31.2% and the polymer had a weight average molecular weight of 18,500 and a molecular weight distribution of 1.8. The weight average molecular weight is measured in terms of polystyrene by GPC (gel permeation chromatography (HLC-8020 of Toso Co., Ltd.).

SYNTHESIS EXAMPLE 2

7 parts by weight of 2,2'-azobis(2,4-dimethylvaleronitrile) and 220 parts by weight of propylene glycol monomethyl ether acetate were charged into a flask equipped with a cooling pipe and a stirrer. Subsequently, 20 parts by weight of styrene, 25 parts by weight of methacrylic acid, 20 parts by weight of phenylmaleimide, 35 parts by weight of β-methylglycidyl methacrylate and 1.5 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-2). The obtained polymer solution had a solids content of 31.0% and the polymer had a weight average molecular weight of 21,000 and a molecular weight distribution of 2.1.

SYNTHESIS EXAMPLE 3

7 parts by weight of 2,2'-azobis(2,4-dimethylvaleronitrile) and 150 parts by weight of propylene glycol monomethyl ether acetate were charged into a flask equipped with a cooling pipe and a stirrer. Subsequently, 20 parts by weight of styrene, 25 parts by weight of methacrylic acid, 20 parts by weight of phenylmaleimide, 35 parts by weight of β-methylglycidyl methacrylate and 1.5 parts by weight of α-methylstyrene dimer were charged and gently stirred while the inside of the flask was substituted with nitrogen. The temperature of the resulting solution was elevated to 70° C. and maintained at that temperature for 4 hours to obtain a polymer solution containing a copolymer (A-3). The obtained polymer solution had a solids content of 39.8% and the polymer had a weight average molecular weight of 23,000 and a molecular weight distribution of 2.4.

SYNTHESIS EXAMPLE 4

7 parts by weight of 2,2'-azobis(2,4-dimethylvaleronitrile) and 220 parts by weight of propylene glycol monomethyl ether acetate were charged into a flask equipped with a cooling pipe and a stirrer. Subsequently, 20 parts by weight of styrene, 30 parts by weight of methacrylic acid, 50 parts by weight of β-methylglycidyl methacrylate and 2.0 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-4). The obtained polymer solution had a solids content of 31.0% and the polymer had a weight average molecular weight of 19,000 and a molecular weight distribution of 1.7.

SYNTHESIS EXAMPLE 5

7 parts by weight of 2,2'-azobis(2,4-dimethylvaleronitrile) and 220 parts by weight of propylene glycol monomethyl ether acetate were charged into a flask equipped with a cooling pipe and a stirrer. Subsequently, 20 parts by weight of styrene, 30 parts by weight of methacrylic acid, 50 parts by weight of CYMA300 (of Daicel Chemical Co., Ltd.) and 2.0 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-5). The obtained polymer solution had a solids content of 30.9% and the polymer had a weight average molecular weight of 21,000 and a molecular weight distribution of 1.8.

Comparative Synthesis Example 1

7 parts by weight of 2,2'-azobis(2,4-dimethylvaleronitrile) and 220 parts by weight of diethylene glycol methylethyl ether were charged into a flask equipped with a cooling pipe and a stirrer. Subsequently, 23 parts by weight of methacrylic acid, 47 parts by weight of dicyclopentanyl methacrylate, 30 parts by weight of glycidyl methacrylate and 2.0 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-1R). The obtained polymer solution had a solids content of 32.8% and the polymer had a weight average molecular weight of 24,000 and a molecular weight distribution of 2.3.

Comparative Synthesis Example 2

7 parts by weight of 2,2'-azobis(2,4-dimethylvaleronitrile) and 220 parts by weight of diethylene glycol methylethyl ether were charged into a flask equipped with a cooling pipe and a stirrer. Subsequently, 25 parts by weight of methacrylic acid, 35 parts by weight of dicyclopentanyl methacrylate, 40 parts by weight of 2-hydroxyethyl methacrylate and 2.0 parts by weight of α-methylstyrene dimer were charged and gently stirred while the inside of the flask was substituted with nitrogen. The temperature of the resulting solution was elevated to 70° C. and maintained at that temperature for 5 hours to obtain a polymer solution containing a copolymer (A-2R). The obtained polymer solution had a solids content of 32.8% and the polymer had a weight average molecular weight of 25,000 and a molecular weight distribution of 2.4.

EXAMPLE 1
Preparation of Radiation Sensitive Resin Composition

The polymer solution (corresponding to 100 parts by weight of the copolymer (A-1) (solid content)) obtained in Synthesis Example 1, 30 parts by weight of 4,4'-[1-[4-[-[4-hydroxyphenyl]-1-methylethyl]phenyl]ethylidene] bisphenol-1,2-naphthoquinonediazide-5-sulfonicacid ester as the component (B) and 5 parts by weight of γ-methacryloxypropyl trimethoxysilane were mixed together and dissolved in propylene glycol monomethyl ether acetate to a solids content of 40 wt %. Thereafter, the resulting solution was filtered with a millipore filter having a pore diameter of 0.5 μm to prepare a radiation sensitive resin composition solution (S-1).

(I) Formation of Thin Film Pattern

The above composition solution (S-1) was coated on a glass substrate with a spinner and prebaked on a hot plate at 80° C. for 5 minutes to form a coating film.

The obtained coating film was exposed to ultraviolet radiation having an intensity at 365 nm of 10 mW/cm$^2$ through a predetermined pattern mask for 15 seconds. Thereafter, the exposed film was developed with a 0.5 wt % aqueous solution of tetramethyl ammonium hydroxide at 25° C. for 2 minutes and washed with running pure water for 1 minute. With these operations, unrequired portions were removed.

The above formed pattern was exposed to ultraviolet radiation having an intensity at 365 nm of 10 mW/cm$^2$ for 30 seconds and cured by heating in an oven at 160° C. for 60 minutes to obtain a thin film pattern having a thickness of 5 μm.

Another thin film pattern was formed by repeating the same operation as described above except that the curing temperature was changed to 180° C.

(II) Evaluation of Resolution

The hole pattern (5 μm×5 μm hole) of the thin film pattern obtained in (I) above is evaluated as ○ (satisfactory) when it can be resolved and × (unsatisfactory) when it cannot be resolved. The results are shown in Table 1.

(III) Evaluation of Storage Stability

The above composition solution was heated in an oven at 40° C. for 1 week to evaluate storage stability according to a change in viscosity before and after heating. The change rate at this point is shown in Table 1. It can be said that when the increase rate of viscosity is smaller than 10%, storage stability is satisfactory and when the increase rate is equal to or larger than 10%, storage stability is unsatisfactory. The results are shown in Table 1.

(IV) Evaluation of Solvent Resistance

The glass substrate having a thin film pattern formed thereon was immersed in N-methylpyrrolidone heated at 50° C. for 10 minutes to evaluate a change in the thickness of the film. The change rate at this point is shown in Table 1. It can be said that when the coefficient of expansion is 0 to 10%, solvent resistance is satisfactory and when the coefficient of expansion is larger than 10% and the thickness of the film is reduced by dissolution, solvent resistance is unsatisfactory.

EXAMPLE 2

A composition solution (S-2) was prepared in the same manner as in Example 1 except that the polymer solution (corresponding to 100 parts by weight (solid content) of the copolymer (A-2)) obtained in Synthesis Example 2 was used in place of the polymer solution obtained in Synthesis Example 1 and evaluated. The results are shown in Table 1.

EXAMPLE 3

A composition solution (S-3) was prepared in the same manner as in Example 1 except that the polymer solution (corresponding to 100 parts by weight (solid content) of the copolymer (A-3)) obtained in Synthesis Example 3 was used in place of the polymer solution obtained in Synthesis Example 1 and evaluated. The results are shown in Table 1.

EXAMPLE 4

A composition solution (S-4) was prepared in the same manner as in Example 1 except that the polymer solution (corresponding to 100 parts by weight (solid content) of the copolymer (A-4)) obtained in Synthesis Example 4 was used in place of the polymer solution obtained in Synthesis Example 1 and evaluated. The results are shown in Table 1.

EXAMPLE 5

A composition solution (S-5) was prepared in the same manner as in Example 1 except that the polymer solution (corresponding to 100 parts by weight (solid content) of the copolymer (A-5)) obtained in Synthesis Example 5 was used in place of the polymer solution obtained in Synthesis Example 1 and evaluated. The results are shown in Table 1.

Comparative Example 1

A composition solution (S-1R) was prepared in the same manner as in Example 1 except that the polymer solution (corresponding to 100 parts by weight (solid content) of the copolymer (A-1R)) obtained in Comparative Synthesis Example 1 was used in place of the polymer solution obtained in Synthesis Example 1 and evaluated. The results are shown in Table 1.

Comparative Example 2

A radiation sensitive resin composition solution (S-2R) was prepared by mixing together the polymer solution (corresponding to 100 parts by weight (solid content) of the copolymer (A-2R)) obtained in Comparative Synthesis Example 2, 30 parts by weight of 4,4'-[1-[4-[1-[4-hydroxyphenyl]-1-methylethyl]phenyl]ethylidene] bisphenol-1,2-naphthoquinonediazide-5-sulfonic acid ester as the component (B), 25 parts by weight of hexamethylol melamine and 5 parts by weight of γ-methacryloxypropyl trimethoxysilane, dissolving them in propylene glycol monomethyl ether acetate to a solids content of 40 wt %, and filtering the resulting solution with a millipore filter having a pore diameter of 0.5 μm.

TABLE 1

|  | curing temperature | resolution | solvent resistance | storage stability |
|---|---|---|---|---|
| Ex. 1 | 160° C. | ○ | 3% | 4% |
|  | 180° C. | ○ | 2% |  |
| Ex. 2 | 160° C. | ○ | 5% | 4% |
|  | 180° C. | ○ | 3% |  |
| Ex. 3 | 160° C. | ○ | 4% | 5% |
|  | 180° C. | ○ | 3% |  |
| Ex. 4 | 160° C. | ○ | 3% | 5% |
|  | 180° C. | ○ | 2% |  |
| Ex. 5 | 160° C. | ○ | 4% | 4% |
|  | 180° C. | ○ | 3% |  |
| C. Ex. 1 | 160° C. | × | 6% | 28% |
|  | 180° C. | × | 4% |  |
| C. Ex. 2 | 160° C. | ○ | −75% | 5% |
|  | 180° C. | ○ | −35% |  |

Ex.: Example
C. Ex.: Comparative Example

According to the present invention, as described above, a radiation sensitive resin composition having resolution, solvent resistance, adhesion to a substrate and storage stability required as an interlaminar insulating film can be obtained.

An interlaminar insulating film excellent in the above physical properties can be formed from the above radiation sensitive resin composition.

What is claimed is:

1. A radiation sensitive resin composition comprising:
   (A) a copolymer obtained by copolymerizing (a1) at least one carboxylic acid compound selected from the group consisting of an unsaturated carboxylic acid and an unsaturated carboxylic anhydride, (a2) at least one unsaturated epoxy compound selected from the group consisting of a monomer represented by the following formula (1):

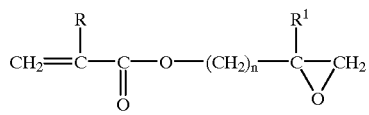

(1)

wherein R is a hydrogen atom or methyl group, $R^1$ is an alkyl group having 1 to 4 carbon atoms, and n is an integer of 1 to 6,
   and a monomer represented by the following formula (2):

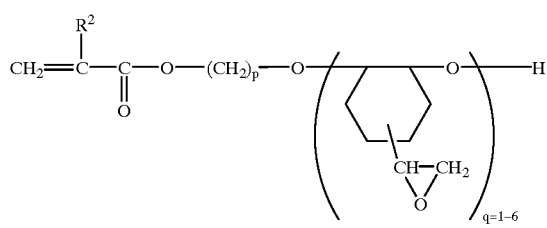

(2)

wherein $R^2$ is a hydrogen atom or methyl group, p is an integer of 1 to 6, and q is an integer of 1 to 6,
   and (a3) an olefinic unsaturated compound other than the above (a1) and (a2); and
   (B) a 1,2-quinonediazide compound.

2. The radiation sensitive resin composition of claim 1, wherein the copolymer (A) comprises 5 to 40 wt % of a constituent unit derived from the carboxylic acid compound (a1), 5 to 60 wt % of a constituent unit derived from the unsaturated epoxy compound (a2) and 10 to 80 wt % of a constituent unit derived from the olefinic unsaturated compound (a3).

3. The radiation sensitive resin composition of claim 1, wherein the 1,2-quinonediazide compound (B) is selected from the group consisting of 1,2-benzoquinonediazidesulfonic acid ester, 1,2-naphthoquinonediazidesulfonic acid ester, 1,2-benzoquinonediazidesulfonic acid amide and 1,2-naphthoquinonediazidesulfonic acid amide.

4. The radiation sensitive resin composition of claim 1 which comprises 100 parts by weight of the copolymer (A) and 5 to 100 parts by weight of the 1,2-quinonediazide compound (B).

5. A process for producing an interlaminar insulating film comprising the steps of:
   (1) preparing a substrate for an interlaminar isolating film having a thin film formed from the radiation sensitive resin composition of claim 1;
   (2) exposing the thin film to radiation through a predetermined pattern mask;
   (3) developing the exposed thin film with an alkali developer to form a thin film pattern; and
   (4) heating the thin film pattern at a temperature lower than 200° C.

6. The process of claim 5, wherein the interlaminar insulating film is an interlaminar insulating film for the recording coil of a magnetic head.

7. A process for the preparation of an interlaminar insulating film for the recording coil of a magnetic head, comprising forming said film with the composition of claim 1.

8. An interlaminar insulating film for the recording coil of a magnetic head, which is formed from the radiation sensitive resin composition of claim 1.

9. The radiation sensitive resin composition of claim 1, wherein (a2) is a monomer of the formula (1).

10. The radiation sensitive resin composition of claim 2, wherein (a2) is a monomer of the formula (1).

11. The radiation sensitive resin composition of claim 3, wherein (a2) is a monomer of the formula (1).

12. The radiation sensitive resin composition of claim 4, wherein (a2) is a monomer of the formula (1).

13. The radiation sensitive resin composition of claim 1, wherein (a2) is a monomer of the formula (2).

14. The radiation sensitive resin composition of claim 2, wherein (a2) is a monomer of the formula (2).

15. The radiation sensitive resin composition of claim 3, wherein (a2) is a monomer of the formula (2).

16. The radiation sensitive resin composition of claim 4, wherein (a2) is a monomer of the formula (2).

17. The radiation sensitive resin composition of claim 1, wherein $R^1$ is an alkyl group having 2–4 carbon atoms.

18. The radiation sensitive resin composition of claim 1, wherein (a2) is a monomer of the formula (1) and $R^1$ is an alkyl group having 2–4 carbon atoms.

19. The process as claimed in claim 5, wherein (a2) is a monomer of the formula (1).

20. The process as claimed in claim 5, wherein (a2) is a monomer of the formula (2).

* * * * *